United States Patent
Hai

(10) Patent No.: US 11,906,839 B2
(45) Date of Patent: Feb. 20, 2024

(54) DISPLAY DEVICE AND ELECTRONIC EQUIPMENT

(71) Applicant: HUIZHOU CHINA STAR OPTOELECTRONICS TECHNOLOGY CO., LTD., Guangdong (CN)

(72) Inventor: Bo Hai, Guangdong (CN)

(73) Assignee: HUIZHOU CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 827 days.

(21) Appl. No.: 16/981,602

(22) PCT Filed: Aug. 4, 2020

(86) PCT No.: PCT/CN2020/106709
§ 371 (c)(1),
(2) Date: Sep. 16, 2020

(87) PCT Pub. No.: WO2022/000694
PCT Pub. Date: Jan. 6, 2022

(65) Prior Publication Data
US 2023/0123310 A1    Apr. 20, 2023

(30) Foreign Application Priority Data
Jul. 1, 2020   (CN) .................. 202010621498.9

(51) Int. Cl.
*G02F 1/1335* (2006.01)
*G02F 1/13363* (2006.01)
*G02B 5/30* (2006.01)
*H10K 50/86* (2023.01)

(52) U.S. Cl.
CPC ..... *G02F 1/133531* (2021.01); *G02B 5/3083* (2013.01); *G02F 1/133638* (2021.01); *G02F 2202/28* (2013.01); *H10K 50/86* (2023.02)

(58) Field of Classification Search
CPC .................. G02F 1/133531; G02F 1/133638
See application file for complete search history.

(56) References Cited

U.S. PATENT DOCUMENTS

2008/0036948 A1   2/2008   Zhong
2008/0309855 A1   12/2008  Yan et al.

FOREIGN PATENT DOCUMENTS

| CN | 101271201 A |   | 9/2008  |     |            |
|----|-------------|---|---------|-----|------------|
| CN | 101978312 A |   | 2/2011  |     |            |
| CN | 102540314 A |   | 7/2012  |     |            |
| CN | 103913887 A | * | 7/2014  | ... | G02F 1/13363 |
| CN | 204964952 U |   | 1/2016  |     |            |
| CN | 205608349 U |   | 9/2016  |     |            |
| CN | 106405925 A |   | 2/2017  |     |            |

(Continued)

*Primary Examiner* — Mariceli Santiago

(57) ABSTRACT

The present disclosure provides a display device and an electronic equipment. The display device includes: a display module, the display module having a light emitting side; a phase retarder, the phase retarder is disposed on the light emitting side of the display module; wherein a range of a compensation value of the phase retarder is [λ/16, λ/4), (λ/4, 7λ/16], [9λ/16, 3λ/4) or (3λ/4, 15λ/16], where λ is a wavelength of light emitted by the display module.

20 Claims, 5 Drawing Sheets

(56) References Cited

FOREIGN PATENT DOCUMENTS

| | | | | | |
|---|---|---|---|---|---|
| CN | 107390435 | A | | 11/2017 | |
| CN | 206638846 | U | | 11/2017 | |
| CN | 110233165 | A | * | 9/2019 | ........... G02B 5/3016 |
| JP | 10010523 | A | * | 1/1998 | |
| JP | H1010523 | A | | 1/1998 | |
| KR | 101700772 | B1 | * | 1/2017 | |

* cited by examiner

| compensation value/nm \ wavelength/nm phase retarder | 450 | 550 | 650 |
|---|---|---|---|
| 1/16 waveplate | 28.13 | 34.38 | 40.63 |
| 4/16 waveplate | 112.50 | 137.50 | 162.50 |
| 7/16 waveplate | 196.88 | 240.63 | 284.38 |
| 9/16 waveplate | 253.13 | 309.38 | 365.63 |
| 12/16 waveplate | 337.50 | 412.50 | 487.50 |
| 15/16 waveplate | 421.88 | 515.63 | 609.38 |

DISPLAY DEVICE AND ELECTRONIC EQUIPMENT

FIELD OF INVENTION

The present disclosure relates to the field of display technologies, and more particularly, to a display device and an electronic equipment.

BACKGROUND OF INVENTION

A flat display device has many advantages, such as a thin body, power conservation, and no radiation, and has been widely used. A conventional flat display device mainly includes a liquid crystal display (LCD) and an organic light emitting diode display (OLED) devices.

Sunglasses are commonly known as tinted glasses used to block sunlight and ultraviolet rays, and widely used in daily life. Nowadays, sunglasses are usually classified as non-polarized sunglasses and polarized sunglasses.

Technical Problems

Polarized sunglasses are equivalent to linear polarizers. When a polarization direction of the light emitted from the display device is perpendicular to a direction of a transmission axis of the polarized sunglasses, the light is absorbed by the sunglasses, so that display images of the display device cannot be seen.

SUMMARY OF INVENTION

Technical Solutions

The present disclosure provides a display device and an electronic equipment to solve the technical problem that display images cannot be seen when the display device is observed by a person wearing polarized sunglasses.

The present disclosure provides an display device, including: a display module, the display module having a light emitting side; a phase retarder, the phase retarder is disposed on the light emitting side of the display module; wherein, a range of a compensation value of the phase retarder is [$\lambda/16$, $\lambda/4$), ($\lambda/4$, $7\lambda/16$], [$9\lambda/16$, $3\lambda/4$) or ($3\lambda/4$, $15\lambda/16$], where $\lambda$ is a wavelength of light emitted by the display module.

In the display device provided in the present disclosure, the range of the compensation value of the phase retarder is [$\lambda_1/16$, $\lambda_1/4$), ($\lambda_1/4$, $7\lambda_1/16$], [$9\lambda_1/16$, $3\lambda_1/4$), and ($\lambda_1/4$, $15\lambda_1/16$)]; the $\lambda_1$ is a wavelength of light with the highest brightness from the light emitted by the display module.

In the display device provided in the present disclosure, a protective layer is disposed on a surface of the phase retarder away from the display module.

In the display device provided in the present disclosure, the phase retarder has a hardened surface, and the hardened surface is a surface of the phase retarder away from the display module.

In the display device provided in the present disclosure, the display device is a liquid crystal display device, and the display module includes: a first polarizer; a liquid crystal display panel, the liquid crystal display panel being disposed on the first polarizer; a second polarizer, the second polarizer being disposed on the liquid crystal display panel; a backlight module, the backlight module being disposed on the second polarizer; wherein, the phase retarder is disposed on a side of the first polarizer away from the liquid crystal display panel.

In the display device provided in the present disclosure, the display device further includes an adhesive layer, and the phase retarder is attached to a surface of the first polarizer away from the liquid crystal display panel by the adhesive layer.

In the display device provided in the present disclosure, an included angle between a slow axis of the phase retarder and a transmission axis of the first polarizer is 45 degrees or 135 degrees.

In the display device provided in the present disclosure, an included angle between the transmission axis of the first polarizer and a horizontal center line of the liquid crystal display panel is 45 degrees or 135 degrees; an included angle between the phase retarder and the horizontal center line of the liquid crystal display panel is 90 degrees or 180 degrees.

In the display device provided in the present disclosure, an included angle between the transmission axis of the first polarizer and a horizontal center line of the liquid crystal display panel is 0 degrees or 90 degrees; an included angle between the phase retarder and the horizontal center line of the liquid crystal display panel is 45 degrees or 135 degrees.

In the display device provided in the present disclosure, the display module includes: an OLED display panel; a third polarizer, the third polarizer being disposed on the OLED display panel; wherein, the phase retarder is disposed on a side of the third polarizer away from the OLED display panel.

In the display device provided in the present disclosure, the phase retarder is a wave plate or a birefringent film.

The present disclosure further provides an electronic equipment, the electronic equipment includes: a display module, the display module having a light emitting side; a phase retarder, the phase retarder is disposed on the light emitting side of the display module; wherein, a range of a compensation value of the phase retarder is [$\lambda/16$, $\lambda/4$), ($\lambda/4$, $7\lambda/16$], [$9\lambda/16$, $3\lambda/4$) or ($3\lambda/4$, $15\lambda/16$], where $\lambda$ is a wavelength of light emitted by the display module.

In the electronic equipment provided in the present disclosure, the range of the compensation value of the phase retarder is [$\lambda_1/16$, $\lambda_1/4$), ($\lambda_1/4$, $7\lambda_1/16$], [$9\lambda_1/16$, $\lambda_1/4$), and ($\lambda_1/4$, $15\lambda_1/16$)]; the $\lambda_1$ is a wavelength of light with the highest brightness from the light emitted by the display module.

In the electronic equipment provided in the present disclosure, the phase retarder has a hardened surface, and the hardened surface is a surface of the phase retarder away from the display module.

In the electronic equipment provided in the present disclosure, the display device is a liquid crystal display device, and the display module includes: a first polarizer; a liquid crystal display panel, the liquid crystal display panel being disposed on the first polarizer; a second polarizer, the second polarizer being disposed on the liquid crystal display panel; a backlight module, the backlight module being disposed on the second polarizer; wherein, the phase retarder is disposed on a side of the first polarizer away from the liquid crystal display panel.

In the electronic equipment provided in the present disclosure, the display device further includes an adhesive layer, and the phase retarder is attached to a surface of the first polarizer away from the liquid crystal display panel by the adhesive layer.

In the electronic equipment provided in the present disclosure, an included angle between a slow axis of the phase retarder and a transmission axis of the first polarizer is 45 degrees or 135 degrees.

In the electronic equipment provided in the present disclosure, an included angle between the transmission axis of the first polarizer and a horizontal center line of the liquid crystal display panel is 45 degrees or 135 degrees; an included angle between the phase retarder and the horizontal center line of the liquid crystal display panel is 90 degrees or 180 degrees.

In the electronic equipment provided in the present disclosure, an included angle between the transmission axis of the first polarizer and a horizontal center line of the liquid crystal display panel is 0 degree or 90 degrees; an included angle between the phase retarder and the horizontal center line of the liquid crystal display panel is 45 degrees or 135 degrees.

In the electronic equipment provided in the present disclosure, the display module includes: an OLED display panel; a third polarizer, the third polarizer being disposed on the OLED display panel; wherein, the phase retarder is disposed on a side of the third polarizer away from the OLED display panel.

Beneficial Effect

The present disclosure provides a display device and an electronic equipment. A phase retarder is disposed on a light-emitting side of a display module, and a range of a compensation value of the phase retarder may be $[\lambda/16, \lambda/4)$, $(\lambda/4, 7\lambda/16]$, $[9\lambda/16, 3\lambda/4)$ or $(3\lambda/4, 15\lambda/16]$, where $\lambda$ is a wavelength of light emitted by the display module. The display device converts linearly polarized light emitted by the display module into elliptically polarized light by the phase retarder, and enables a person wearing polarized sunglasses to observe display images of the display device from different directions.

DESCRIPTION OF DRAWINGS

In order to clearly illustrate the embodiments of the present disclosure or the technical solution in the prior art, accompanying drawings for describing the embodiments or the prior art are simply introduced in the following content. Apparently, the accompanying drawings described below are only some embodiments of the present disclosure. A person of ordinary skill in the art, without creative efforts, can derive other drawings from these drawings.

DETAILED DESCRIPTION OF PREFERRED EMBODIMENTS

The technical solutions in the embodiments of the present disclosure is clearly and completely described below in conjunction with the drawings in the embodiments of the present disclosure. Obviously, the described embodiments are only a part of the embodiments of the present disclosure, rather than all the embodiments. Based on the embodiments of the present disclosure, all other embodiments obtained by those skilled in the art without creative work shall be within the protection scope of the present disclosure.

In the description of the disclosure, it should be understood that the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features, and therefore cannot be understood as a limitation of the disclosure.

Figure 1:
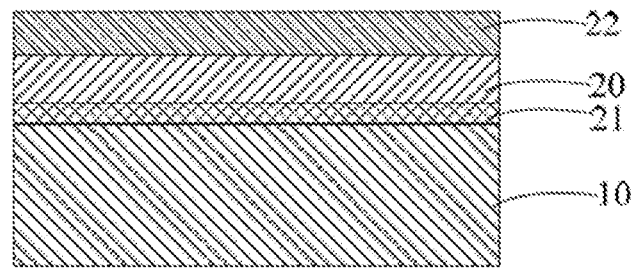
FIG. 1 is a first structurally schematic diagram of a display device provided by the present disclosure.

Refer to FIG. 1. FIG. 1 is a structurally schematic diagram of a display device provided by the present disclosure. The display device includes a display module 10 and a phase retarder 20. The display module 10 has a light emitting side. The phase retarder 20 is disposed on the light emitting side of the display module 10. A range of a compensation value of the phase retarder is $[\lambda/16, \lambda/4)$, $(\lambda/4, 7\lambda/16]$, $[9\lambda/16, 3\lambda/4)$ or $(3\lambda/4, 15\lambda/16]$, where $\lambda$ is a wavelength of light emitted by the display module 10. A side where light emerges after passing through the display module 10 is defined as the light emitting side by the present disclosure.

The display device may be, but is not limited to, a liquid crystal display device or an OLED display device. The phase retarder 20 may be a birefringent film formed by stretching a film which is made of at least one polymer of polycarbonate, polyvinyl alcohol, polystyrene, polymethyl methacrylate, polypropylene, polyolefin, polyarylate, and polyamide. The phase retarder 20 provided by the present disclosure can be a wave plate or other birefringent film with the same function.

The phase retarder 20 can change a polarization state of linearly polarized light passing therethrough, thereby converting the linearly polarized light emitted by the display module 10 into elliptically polarized light, such that even if the display device is rotated at any angle, display images can be seen by a person wearing polarized sunglasses.

Figure 2:
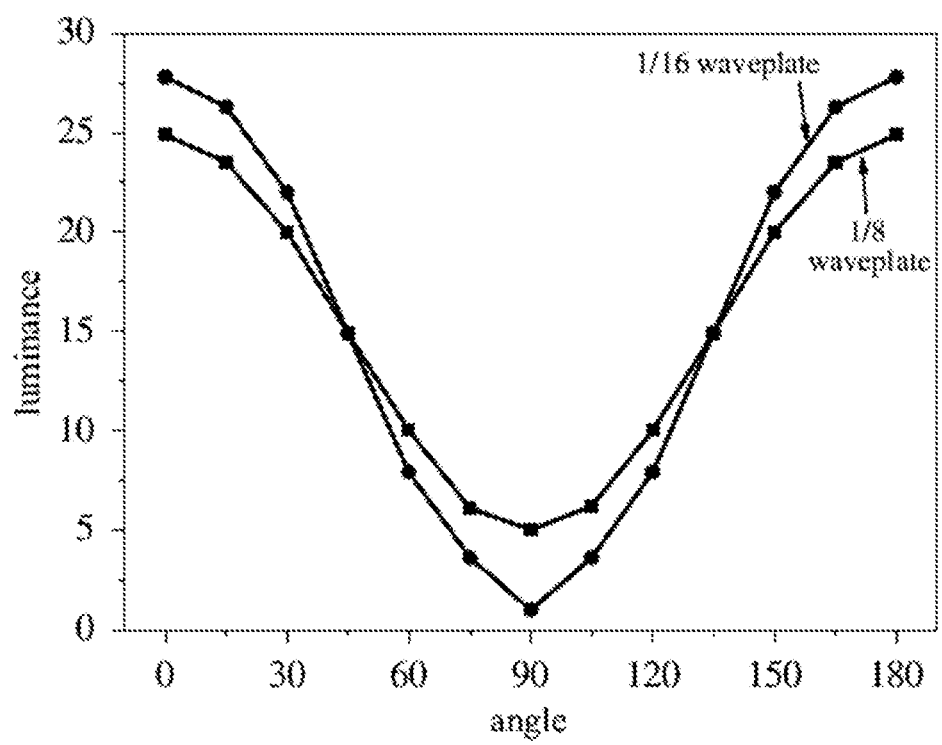
FIG. 2 is a relationship graph between brightness of display images observed via polarized sunglasses and a rotation angle of a display device provided by the present disclosure.

Specifically, refer to FIG. 2. FIG. 2 is a relationship graph between brightness of display images observed via polarized sunglasses and a rotation angle of a display device provided by the present disclosure. An abscissa in FIG. 2 indicates a rotation angle of the display device, and the unit is degree; an ordinate indicates brightness, and the unit is candela/square meter (cd/m). A curve to which a ¹/₁₆ wave plate corresponds in FIG. 2 refers to: the brightness of the display images being observed via the polarized sunglasses when the ¹/₁₆ wave plate is disposed on the display module 10, a polarization direction of the light emitted by the display module 10 is parallel to a transmission axis of the ¹/₁₆ wave plate, and the display device is being rotated. A curve to which a ⅛ wave plate corresponds in FIG. 2 refers to: the brightness of the display images being observed via the polarized sunglasses when the ⅛ wave is disposed on the display module 10, a polarization direction of the light emitted by the display module 10 is parallel to a transmission axis of the ⅛ wave plate, the display device is being rotated. It should be noted that an included angle between a slow axis of the phase retarder 20 and the polarization direction of the light emitted by the display module 10 is 45 degrees or 135 degrees.

It can be seen that the display images still can be seen when a 1/16 wave plate is disposed on the display module 10, but a minimum brightness of the display images is very small. If a compensation value of the wave plate is lower, the minimum brightness is smaller, and it is harder to see the display images. When the ⅛ wave plate is disposed on the display module 10, the minimum brightness of the display images which can be seen is increased. Therefore, the 1/16 wave plate and a corresponding 15/16 wave plate are selected as a minimum and maximum value of the phase retarder 20. Moreover, since a ½ wave plate changes the phase of the linearly polarized light by pi($\pi$), the linearly polarized light is still linearly polarized, and a completely dark screen can still be seen. Therefore, the range of the compensation value of the phase retarder 20 provided by the present disclosure is [$\lambda/16$, $\lambda/4$), ($\lambda/4$, $7\lambda/16$], [$9\lambda/16$, $3\lambda/4$) or ($3\lambda/4$, $15\lambda/16$].

Figure 3:
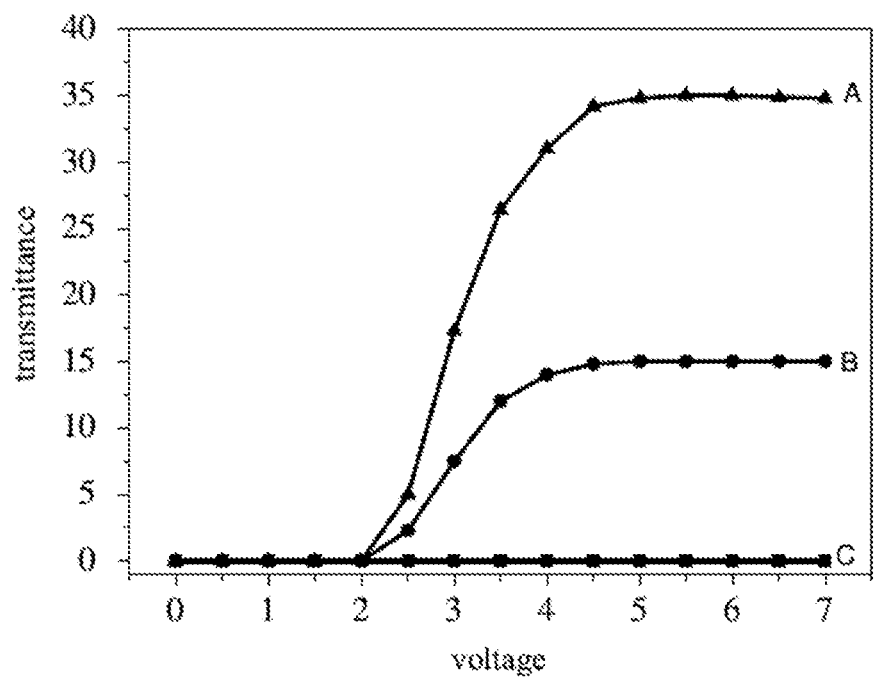
FIG. 3 is a schematic simulation graph of a VT curve provided by the disclosure.

Further, refer to FIG. 3. FIG. 3 is a schematic simulation graph of a VT curve provided by the disclosure. An abscissa in FIG. 3 is a driving voltage of the display device, and the unit is volt (V); an ordinate is a transmittance of light emitted by the display device with polarized sunglasses. There is a unique correspondence between transmittance and brightness. That is, the higher the transmittance, the greater the brightness of the display images observed via the polarized sunglasses.

Specifically, curve A is a transmittance curve of a normal display device (that is, a display device without the phase retarder 20). Curve B is a transmittance curve, which the display device provided by the embodiment of the present disclosure is observed via conventional polarized sunglasses. Curve C is a transmittance curve, which a normal display device is observed via conventional polarized sunglasses. It should be noted that the simulation data is obtained from a simulation when a transmission axis of the conventional polarized sunglasses is kept perpendicular to a polarization direction of the linearly polarized light emitted by the display device. It can be seen that in the display device provided by the embodiments of the present disclosure, when the transmission axis of the conventional polarized sunglasses is kept perpendicular to the polarization direction of the linearly polarized light emitted by the display device, the display images of the display device still can be seen via the polarized sunglasses, and a full black display images is avoided.

The present disclosure provides a display device. The phase retarder 20 is disposed on the light-emitting side of the display module 10, and the range of the compensation value of the phase retarder 20 can be [$\lambda/16$, $\lambda/4$), ($\lambda/4$, $7\lambda$). /16], [$9\lambda/16$, $3\lambda/4$) or ($3\lambda/4$, $15\lambda/16$], where $\lambda$ is the wavelength of light emitted by the display module. The display device converts linearly polarized light emitted by the display module 10 into elliptically polarized light by the phase retarder 20, so that the display images of the display device can be seen from different directions when a person wears polarized sunglasses.

Further, continue to refer to FIG. 1. To protect the phase retarder 20, a protective layer 22 is usually disposed on a surface of the phase retarder 20. Material of the protective layer 22 is cellulose triacetate, which can moreover insulate water vapor and have a support effect for the phase retarder 20. The phase retarder 20 is attached to the display module 10 by an adhesive layer 21. Material of the adhesive layer 21 may be pressure-sensitive adhesive, liquid optical adhesive or solid optical adhesive. The pressure-sensitive adhesive is usually polypropylene adhesive.

Figure 4:
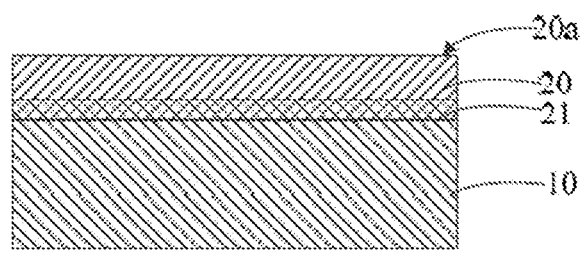
FIG. 4 is a second structurally schematic diagram of a display device provided by the present disclosure.

In some embodiments, refer to FIG. 4. FIG. 4 is a second structurally diagram of the display device provided by the present disclosure. As shown in FIG. 4, the difference from the display device in FIG. 1 is that the protective layer 22 is not disposed on the surface of the phase retarder 20. However, the phase retarder 20 has a hardened surface 20a. The hardened surface 20a is a surface of the phase retarder 20 away from the display module 10. Specifically, a surface treatment is performed on the surface of the phase retarder 20 away from the display module 10 by a process such as a hardening treatment, to increase abrasion resistance of the surface of the phase retarder 20, thereby omitting the protective layer 22, and reducing the thickness of the display device.

In the embodiment of the present disclosure, the range of the compensation value of the phase retarder 20 is [$\lambda_1/16$, $\lambda_1/4$), ($\lambda_1/4$, $7\lambda_1/16$], [$9\lambda_1/16$, $3\lambda_1/4$) and ($3\lambda_1/4$, $15\lambda_1/16$]. The $\lambda_1$ is a wavelength of light with the highest brightness from the light emitted by the display module 10.

It should be noted that the light emitted by the display device may have different wavelengths. For example, it is usually three primary colors RGB, or other combinations of different wavelengths, which can be determined by the settings of the display device in reality. The following embodiments of the present disclosure all take the common three primary colors RGB as examples for description.

Figures 5, 6:
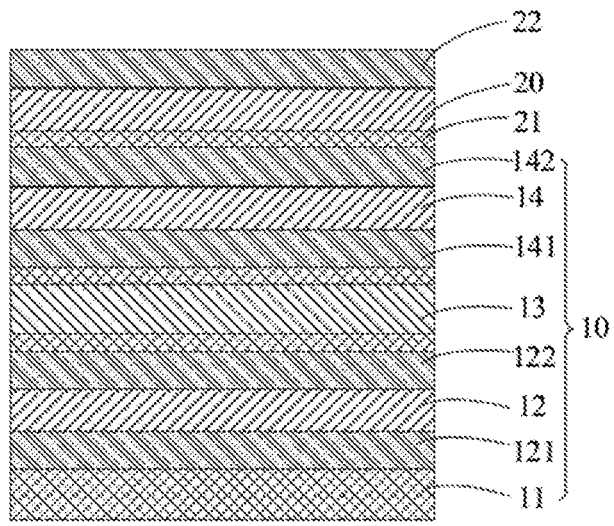
FIG. 5 is a compensation value table for different phase retarders corresponding to different wavelengths of light provided by the present disclosure.
FIG. 6 is a third structurally schematic diagram of a display device provided by the present disclosure.

Specifically, refer to FIG. 5. FIG. 5 is a compensation value table provided by the present disclosure, which different phase retarders 20 corresponds to light with different wavelengths. As shown in FIG. 5, The phase retarder 20 can compensate for the linearly polarized light passing through it, and the compensation values are determined by wavelengths corresponding to the linearly polarized light. For example, when red light with a wavelength of 450 nanometers passes through a 1/16 wave plate, a corresponding compensation value is 28.13 nanometers; when blue light with a wavelength of 550 nanometers passes through the 1/16 wave plate, the corresponding compensation value is 34.38 nanometers; and when red light with a wavelength of 650 nanometers passes through the 1/16 wave plate, the corresponding compensation value is 40.63 nanometers. However, the compensation values mentioned above are all produced by the 1/16 wave plate under ideal conditions.

It can be understood that during an actual production process, due to influence of a manufacturing process, friction and collision, etc., the compensation values of the phase retarder 20 produced for linearly polarized light with different wavelengths has deviations. Therefore, when the phase retarder 20 is selected in the embodiment of the present disclosure, the wavelength $\lambda_1$ of light with the highest brightness from the light emitted by the display module 10 can be determined by testing the compensation value of each phase retarder 20 corresponding to the light emitted by the display module 10, such that the phase retarder 20 with the most accurate compensation value corresponding to the wavelength $\lambda_1$ is selected. Alternatively, when the phase retarder 20 is manufactured, the wavelength $\lambda_1$ of light with the highest brightness from the light emitted by the display module is used as a design basis, so that the compensation value of the phase retarder 20 corresponding to the wavelength $\lambda_1$ is consistent with an ideal value. For example, the light emitted by the display module 10 in the embodiment of the present disclosure is the three primary colors RGB, wherein, the green light has the highest luminous efficiency and the maximum luminous brightness, and human eyes are more sensitive to the green light. Therefore, the use of the phase retarder 20 with a more accurate compensation value corresponding to the green light can further increase the brightness of the display images observed via polarized sunglasses.

In some embodiments, refer to FIG. 6. FIG. 6 is a third structurally schematic diagram of the display device provided by the present disclosure. As shown in FIG. 6, the display device is a liquid crystal display device. The display module 10 includes: a first polarizer 14; a liquid crystal display panel 13, the liquid crystal display panel 13 is disposed on the first polarizer 14; a second polarizer 12, the second polarizer 12 is disposed on the liquid crystal display panel 13; a backlight module 11, the backlight module 11 is disposed on the second polarizer 12; wherein, a phase retarder 20 is disposed on a side of the first polarizer 14 away from the liquid crystal display panel 13.

Specifically, the backlight module 11 is used to provide the light source required by the liquid crystal display panel. A first protective layer 141 is disposed on one side of the first polarizer 14. A second protective layer 142 is disposed on the other side of the first polarizer 14. The phase retarder 20 is attached to the second protective layer 142 by the adhesive layer 21. A third protective layer 121 is disposed on one side of the second polarizer 12. A fourth protective layer 122 is disposed on the other side of the second polarizer 12. Materials of the first protective layer 141, the second protective layer 142, the third protective layer 121, and the fourth protective layer 122 are all cellulose triacetate, which can moreover insulate water vapor, and has a support effect on the first polarizer 14 and the second polarizer 12. In addition, both the first polarizer 14 and the second polarizer 12 are attached to the liquid crystal display panel 13 by pressure-sensitive adhesive or optical adhesive (not shown in the figure). The optical axis of the first polarizer 14 and the optical axis of the second polarizer 12 are perpendicular to each other, which makes the display device in a normally black mode when no voltage is applied, so that the display device has lower brightness in a dark state, thereby achieving high contrast.

In addition, the structures of the backlight module 11, the first polarizer 14 and the second polarizer 12 are all conventional structures in the prior art, and are not be repeated here.

Further, in the embodiment of the present disclosure, the included angle between a slow axis of the phase retarder 20 and a transmission axis of the first polarizer 14 is 45 degrees or 135 degrees.

Specifically, in some embodiments, the included angle between the transmission axis of the first polarizer 14 and a horizontal center line of the liquid crystal display panel 13 is 45 degrees or 135 degrees; the included angle between the phase retarder 20 and the horizontal center line of the liquid crystal display panel 13 is 90 degrees or 180 degrees. For example, in a display device using a TN (Twisted Nematic) display mode, the transmission axis of the first polarizer 14 is usually 45 degrees or 135 degrees, and the transmission axis of the second polarizer 12 is perpendicular to the transmission axis of the first polarizer 14.

In some embodiments, the included angle between the transmission axis of the first polarizer 14 and the horizontal center line of the liquid crystal display panel 13 is 0 degree or 90 degrees. Correspondingly, the included angle between the phase retarder 20 and the horizontal center line of the liquid crystal display panel 13 is 45 degrees or 135 degrees. For example, the transmission axis of the first polarizer 14 of the display device using a vertical alignment (VA) display mode and an in-plane switching (IPS) display mode is usually 0 degree or 90 degrees. The transmission axis of the second polarizer 12 is perpendicular to the transmission axis of the first polarizer 14.

Figure 7:
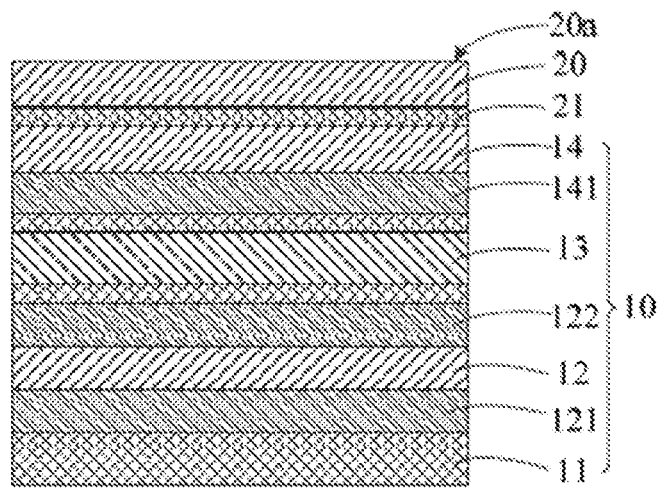
FIG. 7 is a fourth structurally schematic diagram of a display device provided by the present disclosure.

In some embodiments, refer to FIG. 7. FIG. 7 is a fourth structurally schematic diagram of a display device provided in an embodiment of the present disclosure. As shown in FIG. 7, the difference from the display device in FIG. 6 is that in the display device provided by the embodiment of the present disclosure, the protective layer 22 is not disposed on the surface of the phase retarder 20. However, the phase retarder 20 has a hardened surface 20a. The hardened surface 20a is a surface of the phase retarder 20 away from the display module 10. Specifically, a surface treatment is performed on the surface of the phase retarder 20 away from the display module 10 by a process such as a hardening treatment, to increase the wear resistance of the surface of the phase retarder 20. Furthermore, the first protective layer 141 is omitted from one side of the first polarizer 14. The phase retarder 20 can protect the first polarizer 14. The disposition can further save costs and reduce the thickness of the display device.

Figure 8:
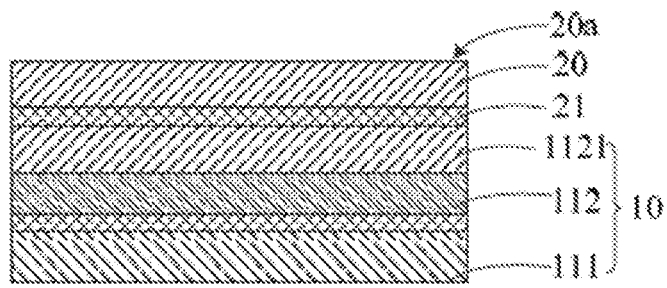
FIG. 8 is a fifth structurally schematic diagram of a display device provided by the present disclosure.

In some embodiments, refer to FIG. 8. FIG. 8 is a fifth structurally schematic diagram of the display device provided by the present disclosure. As shown in FIG. 8, the display device is an OLED display device. The difference from the display device in FIG. 7 is that the display module 10 includes: an OLED display panel 111; a third polarizer 112, and a third polarizer 112 is disposed on the OLED display panel 111; wherein, the phase retarder 20 is disposed on one side of the third polarizer 112 away from the OLED display panel 111.

Specifically, a fifth protective layer 1121 is disposed on one side of the third polarizer 112. The phase retarder 20 is attached to the fifth protective layer 1121 by the adhesive layer 21. Material of the fifth protective layer 122 is cellulose triacetate, which can moreover isolate water vapor and support the third polarizer 1121. In addition, the third polarizer 1121 is attached to the OLED display panel 111 by pressure-sensitive adhesive or optical adhesive (not shown in the figure).

The included angle between the slow axis of the phase retarder 20 and the transmission axis of the third polarizer 1121 is 45 degrees or 135 degrees.

In some embodiments, the included angle between the transmission axis of the third polarizer 1121 and the horizontal center line of the OLED display panel 111 is 45 degrees or 135 degrees. Correspondingly, the included angle between the phase retarder 20 and the horizontal center line of the OLED display panel 111 is 90 degrees or 180 degrees. For example, the transmission axis of the first polarizer 14 in a display device using a twisted nematic (TN) display mode is usually 45 degrees or 135 degrees.

In some embodiments, the included angle between the transmission axis of the third polarizer 1121 and the horizontal center line of the OLED display panel 111 is 0 degree or 90 degrees. Correspondingly, the included angle between the phase retarder 20 and the horizontal center line of the OLED display panel 111 is 45 degrees or 135 degrees.

Correspondingly, the present disclosure also provides an electronic device, which includes the display device described by any claim above. The specific structure of the display device may refer to the above embodiments, and is not repeated here. The electronic device may be a smart phone, a tablet computer, a video player, a personal computer (PC), etc., which is not limited in the present disclosure.

The present disclosure provides an electronic device, the electronic device includes a display module, and a phase retarder is disposed on a light-emitting side of the display module. A range of a compensation value range of the phase retarder may be [$\lambda/16$, $\lambda/4$), ($\lambda/4$, $7\lambda/16$], [$9\lambda/16$, $3\lambda/4$) or ($3\lambda/4$, $15\lambda/16$], where $\lambda$ is a wavelength of light emitted by the display module. The display device converts linearly polarized light emitted by the display module into elliptically polarized light by the phase retarder, so that the display images of the display device can be seen by a person wearing polarized sunglasses from different directions.

Further, a case where a modification of the transmission axis of the polarizer in the display device affects the cost of the display device and the internal structure of the display module is taken into consideration. Therefore, the present disclosure also provides polarized sunglasses. A structure of the polarized sunglasses is improved, such that the images displayed by the conventional display device can be seen by a user wearing the polarized sunglasses at any angle, increasing the user's experience.

Figure 9:
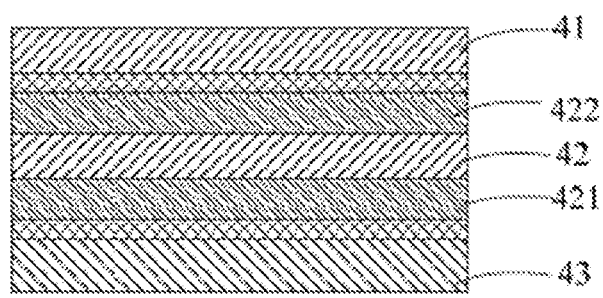
FIG. 9 is a first structurally schematic diagram of polarized sunglasses provided by the present disclosure.

Specifically, refer to FIG. 9. FIG. 9 is a first structurally schematic diagram of polarized sunglasses provided in the present disclosure. As shown in FIG. 9, the polarized sunglasses include: a sunglasses substrate 41, a fourth polarizer 42 and a second phase retarder 43. The fourth polarizer 42 is attached to the sunglasses substrate 41 by pressure-sensitive adhesive or optical adhesive. The second phase retarder 43 is attached to the fourth polarizer 42 by pressure sensitive adhesive or optical adhesive.

Furthermore, a sixth protective layer 421 is disposed on one side of the fourth polarizer 42. A seventh protective layer 422 is disposed on the other side of the fourth polarizer 42. The second phase retarder 43 is attached to the sixth protective layer 421 by pressure-sensitive adhesive or optical adhesive. Materials of the sixth protective layer 421 and the seventh protective layer 422 are both cellulose triacetate, which can moreover isolate water vapor and support the fourth polarizer 42.

The included angle between the transmission axis of the fourth polarizer 42 and the horizontal center line of the sunglasses substrate 41 is 0 degree or 90 degrees. The included angle between a slow axis of the second phase retarder 43 and the polarization direction of the linearly polarized light emitted by the corresponding display device is 45 degrees or 135 degrees. A range of the compensation value of the second phase retarder 43 is [$\lambda/16$, $\lambda/4$), ($\lambda/4$, $7\lambda/16$], [$9\lambda/16$, $3\lambda/4$) or ($3\lambda/4$, $15\lambda/16$], where $\lambda$ is the wavelength of a light emitted by the display module.

In the polarized sunglasses provided by the embodiments of the present disclosure, the second phase retarder 43 is disposed on a surface of the fourth polarizer 42. When the linearly polarized light emitted by the corresponding display device passes through the second phase retarder 43, the linearly polarized light is converted into elliptically polarized light, such that a person wearing the polarized sunglasses is able to see the display images of the display device from different directions, avoiding a situation that the display images of the display device cannot bee seen.

Figure 10:
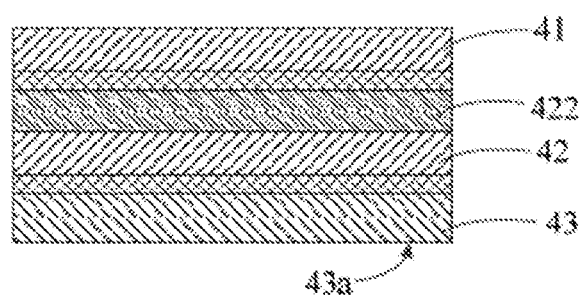
FIG. 10 is a second structurally schematic diagram of polarized sunglasses provided by the present disclosure.

In some embodiments, refer to FIG. 10. FIG. 10 is a second structurally schematic diagram of polarized sunglasses provided in the present disclosure. As shown in FIG. 10, the difference from the polarized sunglasses in FIG. 9 is that the phase retarder 43 has a hardened surface 43a in the polarized sunglasses provided in the embodiment of the present disclosure. The hardened surface 43a is a surface of the phase retarder 43 away from the fourth polarizer 42. Specifically, a surface treatment is performed on the surface of the phase retarder 43 away from the display module 10 by a process such as a hardening treatment, to increase the wear resistance of the surface of the phase retarder 43. Furthermore, the sixth protective layer 421 is omitted from one side of the fourth polarizer 42. The phase retarder 43 can protect the fourth polarizer 42. The disposition can further save costs and reduce the thickness of polarized sunglasses.

A display device and an electronic equipment provided by the embodiments of the present disclosure are introduced in detail above. Specific examples are applied to set forth the principles and implementation of the present disclosure herein. The above descriptions of examples are only intended to help the understanding of the technical solution and the idea of the present disclosure. Moreover, for those skilled in the art, according to the idea of the disclosure, there will be changes in the specific implementation and the application scope. In summary, the content of the specification should not be construed as a limitation to the present disclosure.

What is claimed is:

1. A display device, comprising:
   a display module, the display module having a light emitting side;
   a phase retarder, the phase retarder is disposed on the light emitting side of the display module; wherein,
   a range of a compensation value of the phase retarder is [$\lambda/16$, $\lambda/4$), ($\lambda/4$, $7\lambda/16$], [$9\lambda/16$, $3\lambda/4$) or ($3\lambda/4$, $15\lambda/16$], where $\lambda$ is a wavelength of light emitted by the display module.

2. The display device according to claim 1, wherein the range of the compensation value of the phase retarder is [$\lambda_1/16$, $\lambda_1/4$), ($\lambda_1/4$, $7\lambda_1/16$], [$9\lambda_1/16$, $3\lambda_1/4$), and ($3\lambda_1/4$, $15\lambda_1/16$)];
   the $\lambda_1$ is a wavelength of light with the highest brightness from the light emitted by the display module.

3. The display device according to claim 1, wherein a protective layer is disposed on a surface of the phase retarder away from the display module.

4. The display device according to claim 1, wherein the phase retarder has a hardened surface, and the hardened surface is a surface of the phase retarder away from the display module.

5. The display device according to claim 1, wherein the display device is a liquid crystal display device, and the display module includes:
   a first polarizer;
   a liquid crystal display panel, the liquid crystal display panel being disposed on the first polarizer;
   a second polarizer, the second polarizer being disposed on the liquid crystal display panel;
   a backlight module, the backlight module being disposed on the second polarizer;
   wherein,
   the phase retarder is disposed on a side of the first polarizer away from the liquid crystal display panel.

6. The display device according to claim 5, wherein the display device further includes an adhesive layer, and the phase retarder is attached to a surface of the first polarizer away from the liquid crystal display panel by the adhesive layer.

7. The display device according to claim 5, wherein an included angle between a slow axis of the phase retarder and a transmission axis of the first polarizer is 45 degrees or 135 degrees.

8. The display device according to claim 7, wherein an included angle between the transmission axis of the first polarizer and a horizontal center line of the liquid crystal display panel is 45 degrees or 135 degrees; an included angle between the phase retarder and the horizontal center line of the liquid crystal display panel is 90 degrees or 180 degrees.

9. The display device according to claim 7, wherein an included angle between the transmission axis of the first polarizer and a horizontal center line of the liquid crystal display panel is 0 degrees or 90 degrees; an included angle between the phase retarder and the horizontal center line of the liquid crystal display panel is 45 degrees or 135 degrees.

10. The display device according to claim 1, wherein the display module includes:
an OLED display panel;
a third polarizer, the third polarizer being disposed on the OLED display panel;
wherein,
the phase retarder is disposed on a side of the third polarizer away from the OLED display panel.

11. The display device according to claim 1, wherein the phase retarder is a wave plate or a birefringent film.

12. An electronic equipment, comprising a display device, the display device comprising:
a display module, the display module having a light emitting side;
a phase retarder, the phase retarder is disposed on the light emitting side of the display module; wherein,
a range of a compensation value of the phase retarder is $[\lambda/16, \lambda/4)$, $(\lambda/4, 7\lambda/16]$, $[9\lambda/16, 3\lambda/4)$ or $(3\lambda/4, 15\lambda/16]$, where $\lambda$ is a wavelength of light emitted by the display module.

13. The electronic equipment according to claim 12, the range of the compensation value of the phase retarder is $[\lambda_1/16, \lambda_1/4)$, $(\lambda_1/4, 7\lambda_1/16]$, $[9\lambda_1/16, 3\lambda_1/4)$, and $(3\lambda_1/4, 15\lambda_1/16)]$;
the $\lambda_1$ is a wavelength of light with the highest brightness from the light emitted by the display module.

14. The electronic equipment according to claim 12, wherein the phase retarder has a hardened surface, and the hardened surface is a surface of the phase retarder away from the display module.

15. The electronic equipment according to claim 12, wherein the display device is a liquid crystal display device, and the display module includes:
a first polarizer;
a liquid crystal display panel, the liquid crystal display panel being disposed on the first polarizer;
a second polarizer, the second polarizer being disposed on the liquid crystal display panel;
a backlight module, the backlight module being disposed on the second polarizer;
wherein,
the phase retarder is disposed on a side of the first polarizer away from the liquid crystal display panel.

16. The electronic equipment according to claim 15, wherein the display device further includes an adhesive layer, and the phase retarder is attached to a surface of the first polarizer away from the liquid crystal display panel by the adhesive layer.

17. The electronic equipment according to claim 15, wherein an included angle between a slow axis of the phase retarder and a transmission axis of the first polarizer is 45 degrees or 135 degrees.

18. The electronic equipment according to claim 17, wherein an included angle between the transmission axis of the first polarizer and a horizontal center line of the liquid crystal display panel is 45 degrees or 135 degrees; an included angle between the phase retarder and the horizontal center line of the liquid crystal display panel is 90 degrees or 180 degrees.

19. The electronic equipment according to claim 17, wherein an included angle between the transmission axis of the first polarizer and a horizontal center line of the liquid crystal display panel is 0 degrees or 90 degrees; an included angle between the phase retarder and the horizontal center line of the liquid crystal display panel is 45 degrees or 135 degrees.

20. The electronic equipment according to claim 12, wherein the display module includes:
an OLED display panel;
a third polarizer, the third polarizer being disposed on the OLED display panel;
wherein,
the phase retarder is disposed on a side of the third polarizer away from the OLED display panel.

* * * * *